United States Patent
Lee et al.

(10) Patent No.: US 7,411,290 B2
(45) Date of Patent: Aug. 12, 2008

(54) INTEGRATED CIRCUIT CHIP AND METHOD FOR COOLING AN INTEGRATED CIRCUIT CHIP

(75) Inventors: Poh-Seng Lee, West Lafayette, IN (US); Shih-Chia Chang, Bloomfield Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 214 days.

(21) Appl. No.: 11/198,683

(22) Filed: Aug. 5, 2005

(65) Prior Publication Data

US 2007/0029665 A1 Feb. 8, 2007

(51) Int. Cl.
*H01L 23/34* (2006.01)
*H05K 7/20* (2006.01)

(52) U.S. Cl. .............................. 257/712; 257/E23.103; 257/E23.098; 257/714; 257/722; 361/703; 438/125

(58) Field of Classification Search .................. 257/712, 257/E23.103, E23.098, 714, 722; 361/703; 438/125
See application file for complete search history.

(56) References Cited

U.S. PATENT DOCUMENTS

| 2,997,510 | A | * | 8/1961 | Gier, Jr. | .................... 219/400 |
| 3,204,425 | A | * | 9/1965 | Rush | .......................... 62/485 |
| 7,177,536 | B2 | * | 2/2007 | Natsuhara et al. | ........... 392/479 |

* cited by examiner

Primary Examiner—Alexander O Williams
(74) Attorney, Agent, or Firm—Jimmy L. Funke

(57) ABSTRACT

An integrated circuit chip is provided, the integrated circuit chip having: a base portion, the base portion having a peripheral wall forming an elevated perimeter depending away from a surface of the base potion; a plurality of extensions extending away from the surface, a periphery of each of the plurality of extensions being spaced away from the peripheral wall, the plurality of extensions further comprising a first group of extensions and a second group of extensions, each of the first group of extensions having a greater peripheral area than a peripheral area of each of the second group of extensions and the first group of extensions being aligned with a portion of an integrated circuit disposed on another surface of the base, the portion of the integrated circuit generating a higher heat flux than other portions of the integrated circuit, and a plate secured to the elevated perimeter, the plate the plate covering the plurality of extensions and further comprising an inlet opening and an outlet opening.

20 Claims, 3 Drawing Sheets

INTEGRATED CIRCUIT CHIP AND METHOD
FOR COOLING AN INTEGRATED CIRCUIT
CHIP

FIELD OF THE INVENTION

The present invention relates to a method and apparatus for managing the temperature of integrated circuit chips. Specifically, the invention relates to method and apparatus for managing the temperature gradient across integrated circuit chips.

BACKGROUND OF THE INVENTION

Integrated circuit (IC) components such as integrated circuit chips typically include a base layer or substrate and at least one layer of electrical conductive or non-conductive materials to form the integrated circuit. The substrate is commonly formed from silicon. In operation, as electric current passes through the electrically conductive material and/or semiconductor material, a significant amount of heat may be generated in the IC chip. Depending on the circuit layout on the substrate, non-uniform high temperature areas, "hot spots," may develop across the chip. The hot spots create a temperature gradient across the IC chip which induces thermal stress within the chip. Thermal stress may cause early failure of IC chips and decrease circuit performance.

Current methods for mitigating the hot spots across IC chips include "smart" circuit layout and using "heat spreaders." Smart circuit layout spaces out the components that create hot spots across the IC chip. However, the most thermally efficient circuit layout may not match the most electrically efficient layout. A heat spreader is typically a plate or heat pipe having a high thermal conductivity that is positioned on the IC chip. This increases the overall size and cost of the IC chip. Other methods of cooling or mitigating the hot spots include forming or machining microchannels on the bottom or back side of the substrate layer of the IC chip. A pressurized liquid coolant is then supplied to the microchannels to cool the IC chip.

SUMMARY OF THE INVENTION

One embodiment of the present invention includes an integrated circuit chip comprising a base including first and second surfaces, an electrically conductive material positioned on the first surface of the base, a plurality of fins extending from the second surface of the base, at least two of the plurality of fins positioned along a first axis, at least two of the plurality of fins positioned along a second axis, the first axis perpendicular to the second axis, and a plate coupled to the second surface of the base, the plate being configured to interact with the plurality of fins to define a plurality of channels.

Another embodiment of the present invention includes an integrated circuit chip comprising a base including first and second surfaces and spaced-apart lateral edges, a plurality of circuits positioned on the first surface of the base, a thermal management system including a coolant supply configured to supply a coolant to the base at a position between the spaced-apart lateral edges, a plurality of extensions coupled to the second surface of the base, at least two of the plurality of extensions positioned along a first axis, the first axis parallel to a second axis defined by one of the lateral edges of the base, and a plate coupled to the second surface of the base, the plate being configured to cooperate with the plurality of extensions to define a plurality of channels, the channels being configured to receive the coolant.

Another embodiment of the present invention includes a method of controlling a temperature gradient of an integrated circuit chip comprising the steps of providing a base including first and second surfaces, a plurality of circuits positioned on the first surface of the base, a plurality of fins extending from the second surface of the base, at least two of the plurality of fins positioned along a first axis, at least two of the plurality of fins positioned along a second axis, the first axis parallel to the second axis, and a plate coupled to the second surface of the base, the plate including first and second apertures and being configured to interact with the plurality of fins to define a plurality of channels, and providing a coolant to the channels.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

Figure 1:
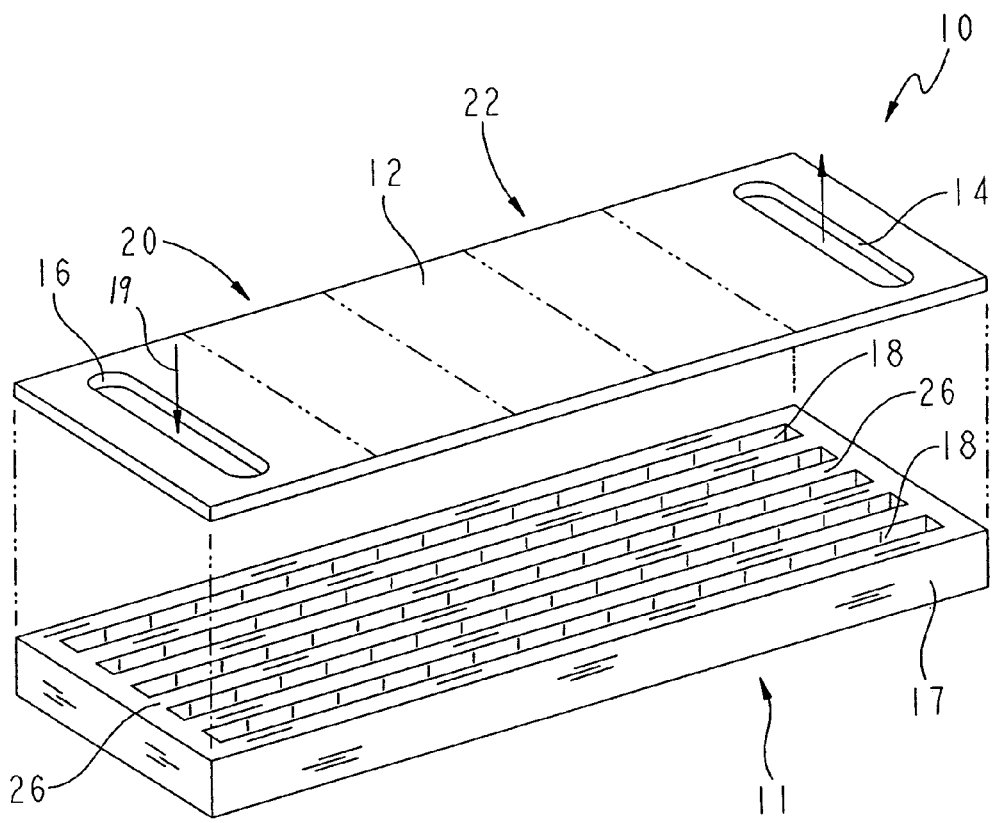
FIG. 1 is an elevated profile assembly view of the bottom side of one embodiment of a prior art integrated circuit chip including a thermal management system.

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate embodiments of the invention in several forms and such exemplification is not to be construed as limiting the scope of the invention in any manner.

DETAILED DESCRIPTION OF THE INVENTION

The embodiments discussed below are not intended to be exhaustive or limit the invention to the precise forms disclosed in the following detailed description. Rather, the embodiments are chosen and described so that others skilled in the art may utilize their teachings.

Figure 2:
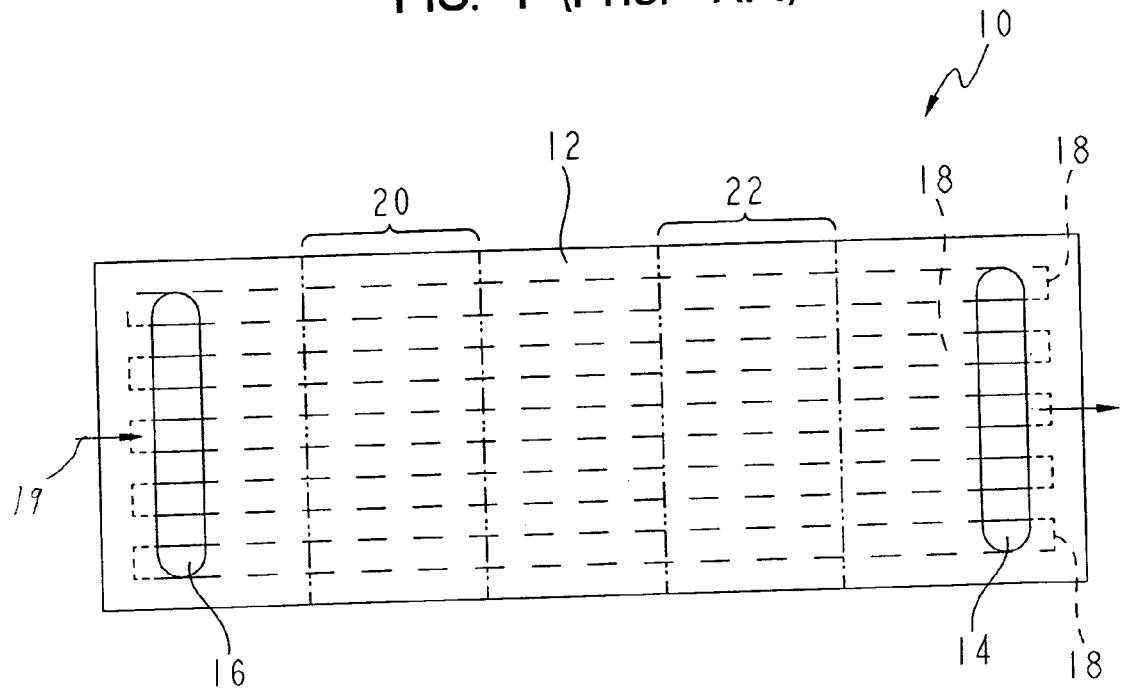
FIG. 2 is a top view the bottom side of the integrated circuit chip shown in FIG. 1.

The bottom side of an integrated circuit (IC) chip having a thermal management system is shown in FIGS. 1 and 2. IC chip 10 includes plate 12 and base 17. The opposing or top side 11 of base 17 includes layers of electrically conductive materials such as copper or aluminum and electrically non-conductive materials such as silicon dioxide or silicon nitride that form an integrated electrical circuit. The base 17, commonly called the substrate, may be constructed of a silicon based material or any other suitable rigid material. Base 17 includes a plurality of microchannels 18 that are formed or machined into base 17. Microchannels 18 are separated by sections 26. Microchannels 18 extend most of the length of the IC chip 10. In this embodiment, base 17 is about 600 microns ($1 \times 10^{-6}$ meters) thick. Microchannels 18 have a depth of about only 400 microns to preserve the structural integrity of the IC chip 10. The thicknesses of the base and the depth of the microchannels may vary depending on the thickness of the wafer (substrate) on which the IC chip is formed. For example, in this embodiment, the substrate is a silicon circular disk about 5 inches (127 millimeters) in diameter. In other embodiments, the thickness of the wafer may be greater, and hence the thickness of the base and/or the depth of the microchannels may be greater.

Plate 12 is generally flat and includes apertures 14 and 16. Plate 12 may be constructed of a silicon based material or any other suitable rigid material. Plate 12 couples to the bottom side of base 17 to close or form the bottom side of microchannels 18. Aperture 16 is configured to receive coolant from a pressurized coolant supply 19. Aperture 16 extends substantially across the width of plate 12 to allow coolant to enter each of the microchannels 18. As the coolant travels through microchannels 18, it absorbs heat produced by IC chip 10. The heated coolant exits microchannels 18 through aperture 14. Aperture 14 defines a shape similar to aperture 16 to allow coolant from each microchannel 18 to exit IC chip 10. In other embodiments, microchannels 18 are formed in plate 12 and the bottom side of base 17 is substantially flat.

Figure 5:
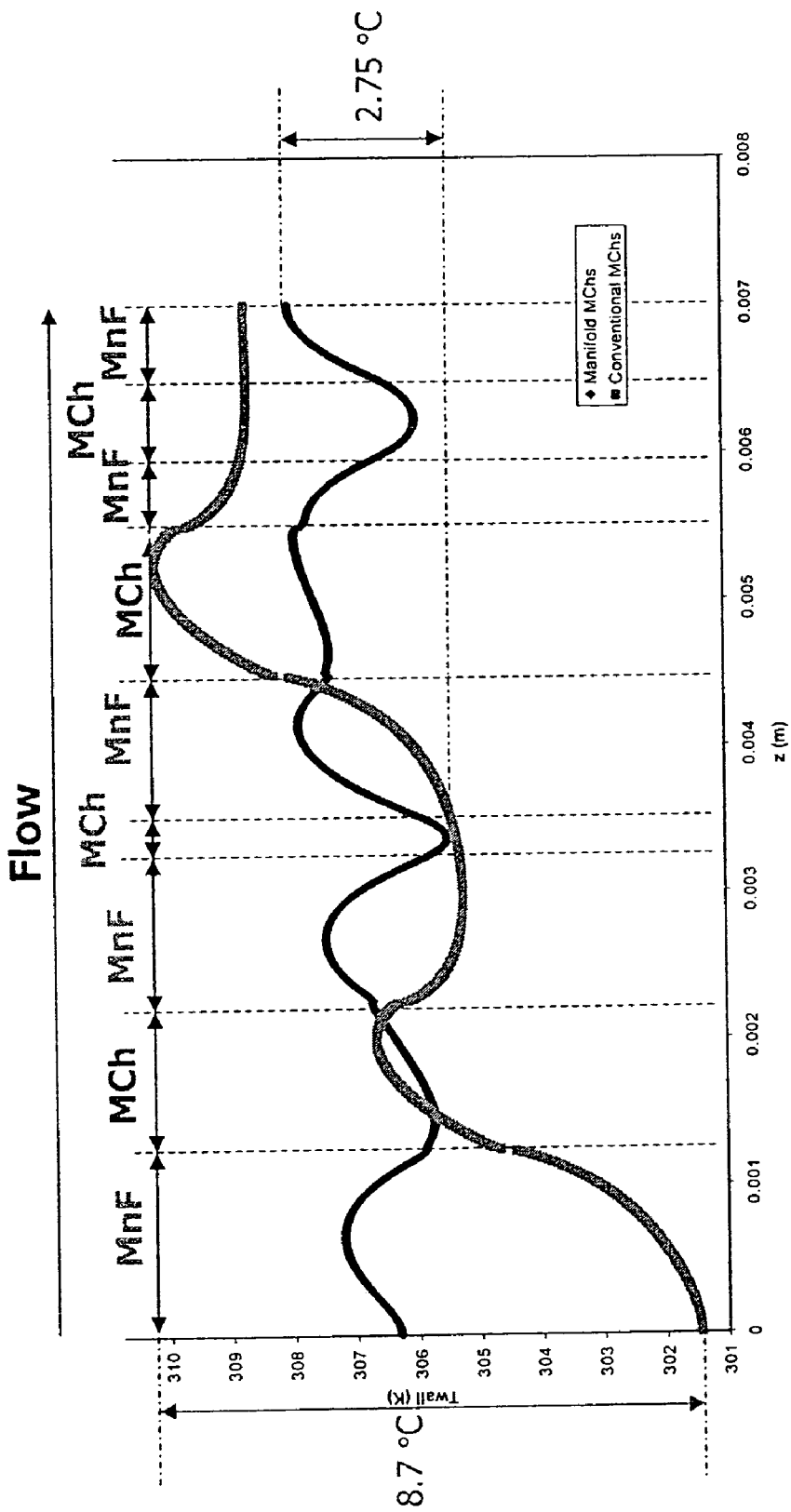
FIG. 5 is a chart illustrating the results of tests for maximum temperature and temperature gradient performed on the integrated circuit chips shown in FIGS. 1 and 2 and FIGS. 3 and 4.

As discussed above, IC chips may have hot spots within the chip that create temperature gradients within the chip which may lead to early failure of the IC chip or may have a detrimental effect on circuit performance. The thermal management capabilities of IC chip 10 were tested using two heated stripes, 20 and 22, which had a heat flux of 100 W/cm$^2$ to simulate hot sports, and other areas with a heat flux of 25 W/cm$^2$. Stripes 20 and 22 and heated areas were positioned on top side 11 of base 17. The position of stripes 20 and 22 is shown in phantom in FIGS. 1 and 2. Coolant was supplied to microchannels 18 and the maximum temperature of IC chip 10 and the temperature gradient across IC chip 10 were measured. The temperature gradient is the difference in the highest and lowest temperatures measured at different position on IC chip 10 during testing. As shown in FIG. 5, the maximum temperature of IC chip 10 was about 310 K and the temperature gradient across IC chip 10 was about 8.7° C.

Figure 3:
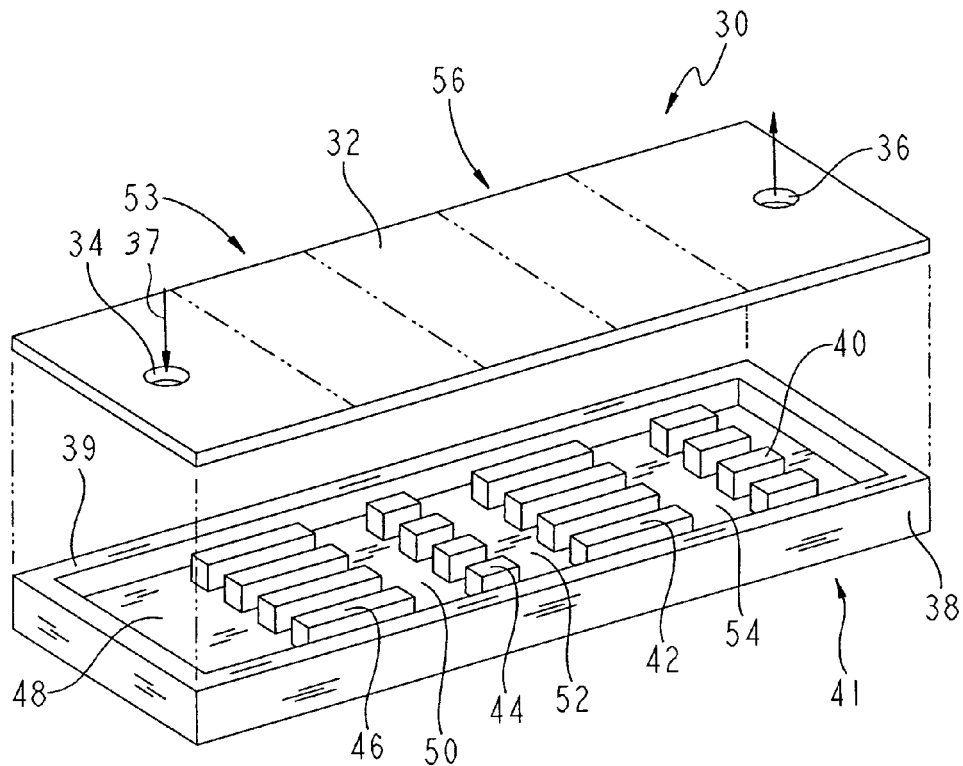
FIG. 3 is an elevated profile assembly view of another embodiment of an integrated circuit chip including a thermal management system.
Figure 4:
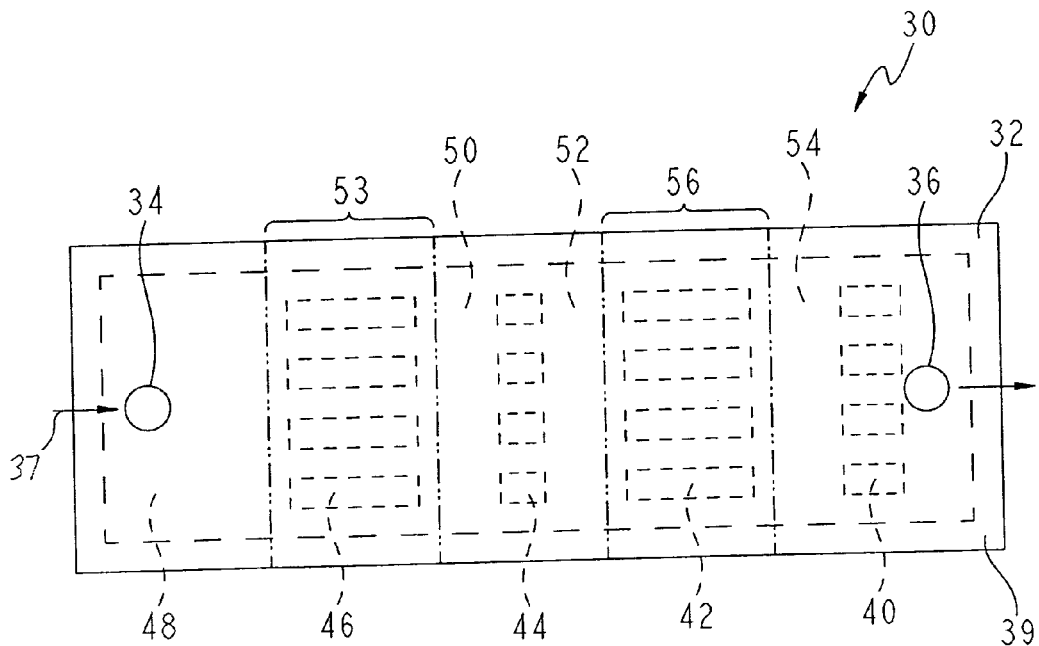
FIG. 4 is a top view the bottom side of the bottom side of the integrated circuit chip shown in FIG. 3.

Another embodiment of an IC chip having a thermal management system is shown in FIGS. 3 and 4. IC chip 30 includes plate 32 and base 38. Similar to IC chip 10 discussed above, the opposing or top side 41 of base 38 includes layers of an electrically conductive material such as copper or aluminum and electrically non-conductive materials such as silicon dioxide and silicon nitride that form an integrated electrical circuit. Base 38 includes sidewall 39 that forms an elevated perimeter around base 38 and couples to plate 32. Base 38 also includes four rows of extensions or fins 40, 42, 44, and 46 that extend from base 38 and four manifold areas 48, 50, 52, and 54. Manifold area 48 is defined between a portion of sidewall 39 and extensions 46. Similarly, another manifold area 50 is defined between extensions 46 and 44. Manifold area 52 is defined between extensions 44 and 42 and manifold area 54 is defined between extensions 42 and 40. Extensions 40, 42, 44, and 46 are shown positioned perpendicularly relative to sidewall 39, however in other embodiments (not shown) they may be positioned in a transverse orientation.

Plate 32 is generally flat and includes apertures 34 and 36. Plate 32 may constructed of a silicon based material or any other suitable rigid material. Plate 32 couples to the bottom side of base 38 and cooperates with sidewall 39 and extensions 40, 42, 44, and 46 to define a series of microchannels. Aperture 34 is configured to receive coolant from a pressurized coolant supply 37. In this embodiment, aperture 34 is substantially round to allow coolant to enter manifold area 48. The coolant then passes through microchannels defined by extensions 46 and absorbs heat produced by IC chip 30. The coolant then enters manifold area 50 where some mixing occurs before the coolant passes through microchannels defined by extensions 44. The coolant then enters manifold area 52 where some mixing occurs before the coolant passes through microchannels defined by extensions 42. The coolant then enters manifold area 50 where some mixing occurs before the coolant passes through microchannels defined by 40. After passing through the channels defined by extensions 40, the coolant exits base 38 through aperture 36. As the coolant travels through the microchannels defined by extensions 40, 42, 44, and 46 it absorbs heat produced by IC chip 30.

A test similar to the one described above was performed on IC chip 30. The thermal management capabilities of IC chip 30 were tested using two heated stripes, 53 and 56, which were positioned on top side 41 of base 38. The position of stripes 53 and 56 is shown in phantom in FIGS. 3 and 4. Stripes 53 and 56 had a heat flux of 100 W/cm$^2$ and other areas had a heat flux of 25 W/cm$^2$. The "smart" layout or positioning and size of extensions 40, 42, 44, and 46 was configured to maximize the cooling effect of the coolant. Coolant was supplied to manifold area 48 through aperture 34 and the maximum temperature of IC chip 30 and the temperature gradient across IC chip 30 were measured. As shown in FIG. 5, the maximum temperature of IC chip 30 was about 308 K and the temperature gradient across IC chip 30 was about 2.75° C. Placing the extensions 40, 42, 44, and 46 at positions adjacent to the simulated hot spots on IC chip 30, as shown in FIGS. 3 and 4, reduced the maximum chip temperature and the temperature gradient across the IC chip 30.

In other embodiments (not shown), the extensions extending from the base are positioned adjacent to hot spots present in that specific IC chip. As discussed above, IC chips may have hot spots in a various positions due to the design of the electrical circuit. The "smart" layout of the extensions at positions adjacent to hot spots may be incorporated into any IC chip. The plurality of extensions, the sizing of the extensions, and the manifold areas promote mixing and viscous flow patterns within the coolant to increase the heat transfer rate. It should be understood from the foregoing, that a "smart" layout of a plurality of extensions may be incorporated into existing IC chips or may be incorporated into the design of new IC chips to mitigate the IC chip temperature and the temperature gradient across the IC chip.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. An integrated circuit chip, comprising:
   a base portion, the base portion having a peripheral wall forming an elevated perimeter depending away from a surface of the base portion;
   a plurality of extensions extending away from the surface, a periphery of each of the plurality of extensions being spaced away from the peripheral wall, the plurality of extensions further comprising a first group of extensions and a second group of extensions, each of the first group of extensions having a greater peripheral area than a peripheral area of each of the second group of extensions and the first group of extensions being aligned with a portion of an integrated circuit disposed on another surface of the base, the portion of the integrated circuit generating a higher heat flux than other portions of the integrated circuit; and a plate secured to the elevated perimeter, the plate the plate covering the plurality of extensions and further comprising an inlet opening and an outlet opening.

2. The integrated circuit chip of claim 1, wherein the plurality of extensions define a plurality of channels to receive a coolant flowing from the inlet opening to the outlet opening, the coolant absorbing heat produced by the integrated circuit and flowing through the plurality of extensions.

3. The integrated circuit chip of claim 2, wherein the plurality of extensions are positioned on the surface to promote viscous flow of the coolant through the plurality of channels.

4. The integrated circuit chip of claim 1, wherein the plurality of extensions extend about 400 microns from the surface.

5. The integrated circuit chip of claim 1, wherein at least two mixing regions are positioned between the first group of extensions and the second group of extensions and the plurality of extensions are integrally formed with the base portion.

6. The integrated circuit chip of claim 2, wherein at least two mixing regions are positioned between the first group of extensions and the second group of extensions and the base portion, the plurality of extensions and the plate are formed from a silicon based material and the plurality of extensions are integrally formed with the base portion.

7. The integrated circuit chip of claim 6, wherein the at least two mixing regions are in fluid communication with the plurality of channels and the plurality of extensions are formed by machining the base portion.

8. The integrated circuit chip of claim 7, wherein the inlet opening is located proximate one of the at least two mixing regions.

9. The integrated circuit chip of claim 7, wherein each of the first group of extensions and the second group of extensions are rectangular in shape, each of the first group of extensions have a perimeter that is greater than a corresponding perimeter of each of the second group of extensions.

10. The integrated circuit chip of claim 1, wherein the base portion is circular or rectangular in shape and the plurality of extensions define a plurality of channels to receive a coolant flowing from the inlet opening to the outlet opening, the coolant absorbing heat produced by the integrated circuit and flowing through the plurality of extensions.

11. An integrated circuit chip, comprising:
a base portion, the base portion having a peripheral wall forming an elevated perimeter depending away from a surface of the base portion;
a plurality of extensions located within the elevated perimeter of the peripheral wall and extending from the surface, a periphery of each of the plurality of extensions being spaced away from the peripheral wall and the plurality of extensions further comprising a first group of extensions and a second group of extensions, the first group of extensions having two discrete areas of extensions and the second group of extensions having two discrete areas of extensions, each of the first group of extensions having a greater peripheral area than a peripheral area of each of the second group of extensions and each discrete area of the first group of extensions being aligned with a portion of an integrated circuit disposed on another surface of the base, the portion of the integrated circuit generating a higher heat flux than other portions of the integrated circuit; and
a plate engaging the elevated perimeter and covering the plurality of extensions, the plate further comprising an inlet opening and an outlet opening.

12. The integrated circuit chip of claim 11, wherein the two discrete areas of the first group of extensions are alternately arranged with the two discrete areas of the second group of extensions.

13. The integrated circuit chip of claim 12, wherein the plurality of extensions define a plurality of channels to receive a coolant flowing from the inlet opening to the outlet opening, the coolant absorbing heat produced by the integrated circuit and flowing through the plurality of extensions the first group of extensions absorbing a greater amount of heat flux than the second group of extensions.

14. The integrated circuit chip of claim 13, wherein at least two mixing regions are disposed between the first group of extensions and the second group of extensions and the at least two mixing regions are in fluid communication with the plurality of channels.

15. The integrated circuit chip of claim 14, wherein the inlet opening is located proximate to one of the at least two mixing regions and the outlet is located proximate to another one of the at least two mixing regions.

16. A method of controlling a temperature gradient of an integrated circuit of an integrated circuit chip, the method comprising:
passing a coolant by a first group of a plurality of extensions extending from a surface of a base portion of the integrated circuit chip, the base portion having a peripheral wall forming an elevated perimeter depending away from the surface of the base portion, the plurality of extensions being located within the elevated perimeter of the peripheral wall and a periphery of each of the plurality of extensions being spaced away from the peripheral wall, the first group of extensions being aligned with a portion of an integrated circuit disposed on another surface of the base portion, the portion of the integrated circuit generating a higher heat flux than other portions of the integrated circuit, coolant cooling the portion of the integrated circuit; and
passing the coolant by a second group of extensions of the plurality of extensions, the second group of extensions being aligned with other portions of the integrated circuit, the coolant cooling the other portions of the integrated circuit, the periphery of each of the first group of extensions being larger than a periphery of each of the second group of extensions.

17. The method of claim 16, wherein the base portion further comprises a plate engaging the elevated perimeter of the peripheral wall to define a plurality of channels between the plurality of extensions.

18. The method of claim 17, wherein the first group of extensions are located within two discrete areas and the second group of extensions are located within another two discrete areas, the two discrete areas and the another two discrete areas being arranged in an alternating fashion.

19. The method of claim 18, wherein at least two mixing regions are disposed between the two discrete areas and the another two discrete areas and the at least two mixing regions are in fluid communication with the plurality of channels.

20. The method of claim 19, wherein the plate includes an inlet opening proximate to one of the at least two mixing regions.

* * * * *